United States Patent [19]

Sakai et al.

[11] 4,320,534
[45] Mar. 16, 1982

[54] LOUDNESS CONTROL CIRCUIT

[75] Inventors: Koichi Sakai; Satoru Horie, both of Tokyo, Japan

[73] Assignee: Toko Kabushiki Kaisha, Tokyo, Japan

[21] Appl. No.: 200,064

[22] Filed: Oct. 23, 1980

[30] Foreign Application Priority Data

Oct. 25, 1979 [JP] Japan ................................ 54-138135
Nov. 22, 1979 [JP] Japan ............................ 54-161878[U]

[51] Int. Cl.³ .......................... H03G 5/14; H04B 1/16
[52] U.S. Cl. .................................... 455/267; 179/1 D; 179/1 VL; 333/28 R; 333/28 T
[58] Field of Search ............ 455/267; 179/1 D, 1 VL; 330/126, 302, 304, 306; 333/28 T, 28 R

[56] References Cited

U.S. PATENT DOCUMENTS 3,849,601 11/1974 Goncharoff ......................... 455/267
4,205,274 5/1980 Tsukada ............................. 455/267
4,228,402 10/1980 Plummer .......................... 179/1 VL
4,262,260 4/1981 Tamura .............................. 179/1 D
4,284,965 8/1981 Higashi ............................. 333/28 T Primary Examiner—Howard Britton
Attorney, Agent, or Firm—Wenderoth, Lind & Ponack

[57] ABSTRACT

In a loudness control circuit, the output DC voltage of a first variable DC voltage source is applied to a first amplifier for increasing volume to vary the gain of the latter, and to first and second differential amplifiers, while the output DC voltages of second and third variable DC sources are applied to the first and second differential amplifiers to provide difference voltages, which the applied to second and third tone control amplifiers which amplify the low and high frequency ranges, respectively, to control the gains thereof, so that the components of the sound in the low and high frequency ranges are boosted, thus achieving the weighting.

3 Claims, 5 Drawing Figures

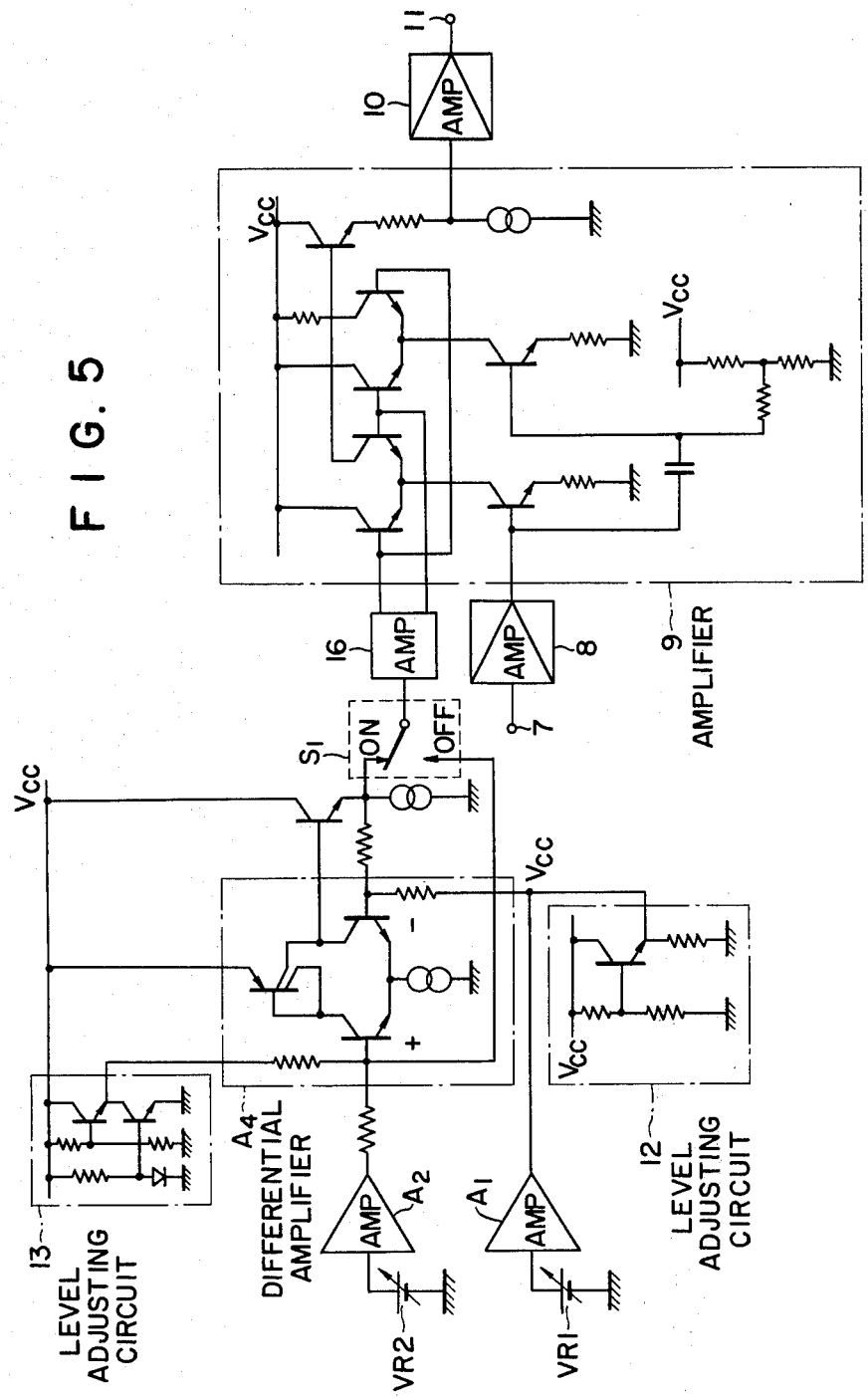

LOUDNESS CONTROL CIRCUIT

BACKGROUND OF THE INVENTION

This invention relates to loudness control circuits in acoustic devices such as radio sets.

As is well known in the art, the hearing characteristic of a human being is such that, when the volume of sound is sufficiently large, then he can hear it substantially equally in quality or tone throughout the frequencies, but as the volume of sound is made smaller, it becomes difficult for him to hear the sound in the low and high frequency ranges.

Accordingly, the invention relates to the function of a loudness control circuit that, when the volume of sound is small, the low and high frequency ranges are automatically boosted to allow a person to hear the sound substantially uniformly in tone throughout the frequencies, and to a loudness control circuit in which the low and high frequency ranges are automatically most suitably boosted according to the variations in electric field strength of an FM broadcast wave.

A conventional loudness control circuit, as shown in FIG. 1, comprises: variable resistors 1 and 2; a CR circuit 3; a loudness switch 4; an input terminal 5; and an output terminal 6. The intermediate tap of the variable resistor 2 is connected to the CR circuit 3. When the slider of the variable resistor 1 is operated to reduce the volume, the high and low frequency ranges are boosted by the CR circuit 3 to make the volume and the quality of sound flat.

That is, in the conventional loudness control circuit, the volume and the quality of sound are adjusted by the variable resistors 1 and 2 and the CR circuit 3. Accordingly, when the loudness control circuit is inserted in an acoustic device, then the loss in gain is increased.

Furthermore, the loudness control circuit is disadvantageous in that, when the sliding contact of the variable resistor is set higher than the intermediate tap to increase the volume, the compensation effect of the loudness control circuit is inadequate.

In addition, it is impossible to provide the loudness control circuit employing the CR circuit in the form of an intergrated circuit.

Under the condition that, in receiving an FM broadcast signal, its electric field strength varies frequently, it is impossible for the conventional loudness control circuit in FIG. 1 to weight the loudness characteristic.

One example of the loudness control circuit will be described with reference to FIG. 2. When the volume is increased to the maximum value, then a flat frequency characteristic is obtained. Under this condition, the volume is gradually decreased. If, in this operation, the volume is boosted by 4 dB in the frequency ranges of 100 Hz and 10 KHz when the volume is decreased by 10 to 20 dB, and also the volume is boosted by 8 dB in the frequency ranges of 100 Hz and 10 KHz when the volumen is further decreased by 30 dB, then the person hears the produced sound flat in the quality of sound. The above-described data are typical one. That is, it goes without saying that the high and low frequency ranges can be boosted with the volume decreased as much as given levels.

SUMMARY OF THE INVENTION

Accordingly, an object of this invention is to provide a loudness control circuit in which the above-described difficulty that the weighting cannot be sufficiently achieved depending on the postion of the sliding contact of the variable resistor in the conventional loudness control circuit, has been eliminated.

Another object of the invention is to provide a loudness control circuit which can be provided in the form of an integrated circuit, and in which as the volume is decreased, the sound in the high and low frequency ranges is automatically boosted with the aid of DC voltages outputted by variable DC voltage sources.

A further object of the invention is to provide a loudness control circuit in which the sound in the low and high frequency ranges are automatically boosted with the electric field strength of a received broadcast wave such as an FM broadcast wave.

The principle, nature and utility of the invention will become more apparent from the following detailed description when read in conjunction with the accompanying drawings.

BRIEF DESCRIPTION OF THE DRAWINGS

In the accompanying drawings:

FIG. 5 is an electrical circuit diagram showing a part of the loudness control circuit of the invention more concretely.

DETAILED DESCRIPTION OF THE INVENTION

Figure 1:
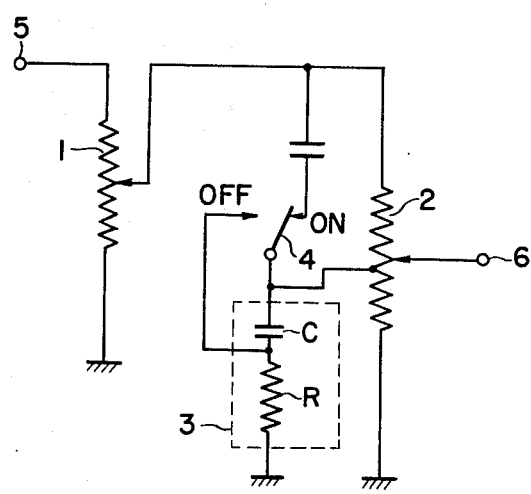
FIG. 1 is a circuit diagram showing one example of a conventional loudness control circuit.
Figure 2:
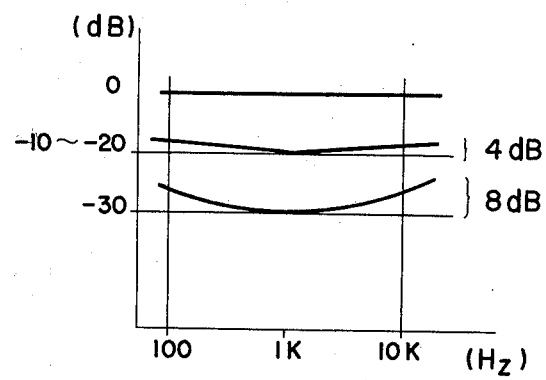
FIG. 2 is a graphical representation for a description of the operation of the conventional loudness control circuit.
Figure 3:
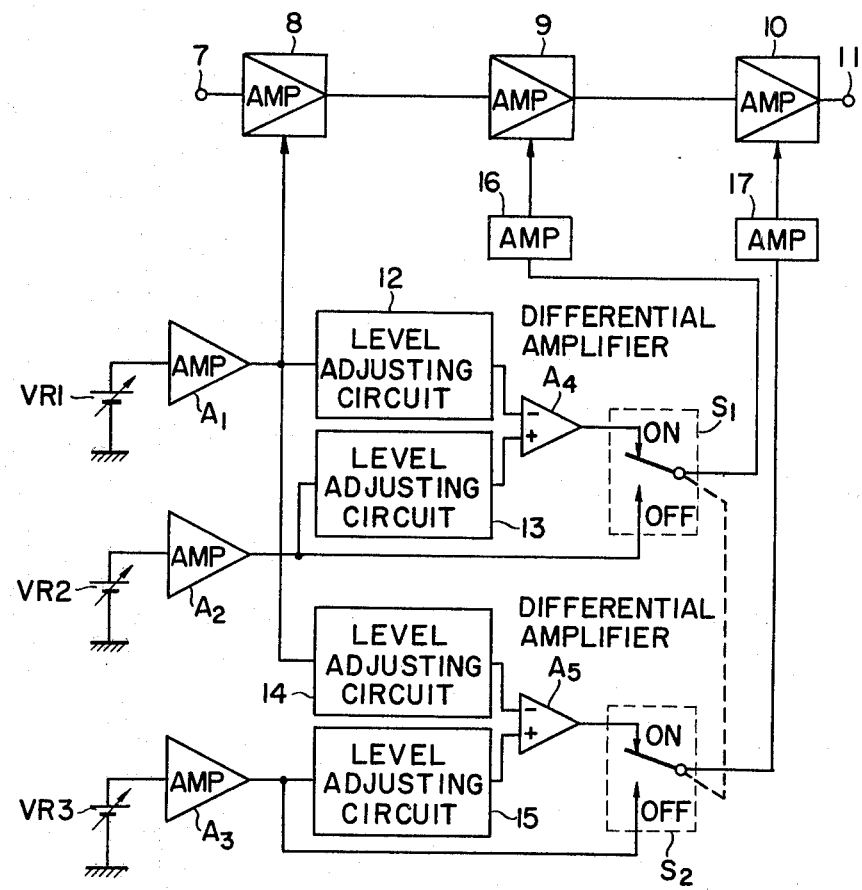
FIG. 3 is a block diagram showing one example of a loudness control circuit according to this invention.

One example of a loudness control circuit according to this invention, as shown in FIG. 3, comprises: an amplifier 8 for amplifying volume; a tone control amplifier 9 for boosting the low frequency range; a tone control amplifier 10 for boosting the high frequency range; an audio signal input terminal; and an output terminal.

The loudness control circuit further comprises: a variable DC voltage source VR1 for adjusting volume; a variable DC voltage source VR2 for adjusting the quality of sound in the low frequency range; and a variable DC voltage source VR3 for adjusting the quality of sound in the high frequency range.

The variable DC voltage of the source VR1 is applied through a buffer amplifier A1 to the amplifier 8 and to first input terminals (−) of differential amplifiers A4 and A5. The variable DC voltage of the source VR2 is applied through a buffer amplifier A2 to a second input terminal (+) of the differential amplifier A4. The variable DC voltage of the source VR3 is applied through a buffer amplifier A3 to a second input terminal (+) of the differential amplifier A5.

Loudness switches S1 and S2 are provided to select manual tone adjustment or automatic tone adjustment. A circuit system for supplying the outputs of the voltage sources VR2 and VR3 through amplifiers 16 and 17 to the tone control amplifiers 9 and 10 is a circuit system for manually adjusting tone. A circuit system for supplying the outputs of the differential amplifiers A4 and A5 through the switches S1 and S2 to the tone control amplifiers 9 and 10 are a circuit system for automatically adjusting tone.

In FIG. 3, reference numerals 12 through 15 designate level adjusting circuits including clipping circuits, which operate to adjust the DC voltages supplied to the differential amplifiers A4 and A5. That is, the level adjusting circuits 12 through 15 are provided to determine a tone control range, and therefore the provision of these circuits 12 through 15 is not always necessary.

In the loudness control circuit in FIG. 3, the tone is compensated by the differential amplifiers A4 and A5 according to the adjustment of volume. The variable DC voltage for adjusting volume is applied to the first input terminals of the amplifiers A4 and A5, while the reference voltages are applied to the second input terminals of the amplifiers A4 and A5 for maintaining the tone flat irrespective of the variations of volume. The voltages thus applied to the input terminals of the differential amplifiers A4 and A5 are subjected to comparison to provide difference voltages, which are applied to the tone control amplifiers 9 and 10 so as to control the gains of the latter, whereby the tone is compensated according to the volume. In this connection, the low and high frequency ranges can be boosted as desired by varying the output voltages of the variable DC voltage source VR2 and VR3.

Figure 4:
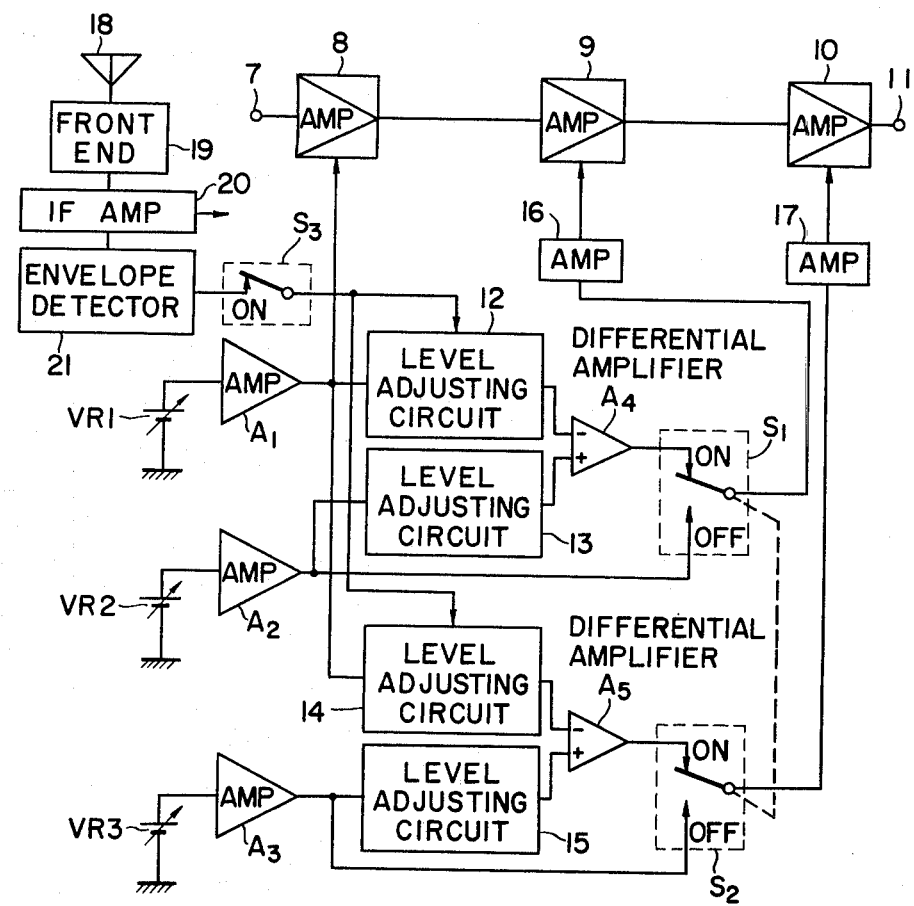
FIG. 4 is also a block diagram showing another example of the loudness control circuit of the invention.

Another exmple of the loudness control circuit according to the invention is as shown in FIG. 4, in which the high and low frequency ranges are boosted in response to variations in volume due to electric field strength variations in FM broadcast signals or the like. The circuit shown in FIG. 4 can be obtained by adding to the circuit shown in FIG. 4 a circuit system for converting the electric field strength of a broadcast signal such as an FM broadcast signal into a DC voltage.

The DC voltage corresponding to the electric field strength is applied to the first input terminals of the differential amplifiers A4 and A5, so that the high and low frequency ranges are boosted in response to the descrease of the electric field strength thereby to maintain the weighting characteristic flat.

In FIG. 4, reference numeral 18 designates an antenna; 19, a front end; 20, an intermediate frequency amplifier; and 21, an envelope detector; and reference character S3 designates a switch which is operated to supply the DC voltage corresponding to the electric field strength of a broadcast signal to the first input terminals (—) of the differential amplifiers A4 and A5. The remaining components are similar to those in FIG. 3.

FIG. 5 shows one concrete example of the loudness control circuit according to the invention. That is, FIG. 5 is a circit diagram showing the differential amplifier A4 and the tone control amplifer 9 more concretely. As is clear from FIG. 5, the tone control amplifier 9 is a double balance type differential amplifier; however, the invention is not limited thereto or thereby.

As is apparent from the above description, the loudness control circuit of the invention can be provided in the form of an integrated circuit in which the weighting is automatically carried out in response to the descrease of volume.

The reference voltages for maintaining the tone flat irrespective of the decrease of volume and the DC voltage for adjusting volume are applied to the differential amplifiers A4 and A5, where these voltages are subjected to comparison to provide the difference voltages, which are applied to the amplifiers for adjusting the tone in the high and low frequency ranges to adjust the gains thereof, so that the tone is maintained flat even when the volume is decreased.

In the case where the volume is decreased with electric field strength of an FM broadcast signal or the like, the differntial amplifiers operate in the same manner to boost the high and low frequency ranges, thereby to maintain the tone flat.

Furthermore, according to the invention, the signal levels in the high and low frequency ranges can be increased as desired.

Thus, the loudness control circuit of the invention is most effectively applicable to radio sets on vehicles which are used under the condition that the electric field strength is frequently changed.

What is claimed is:

1. A loudness control circuit which comprises:
   a first amplifier for increasing volume;
   a second tone control amplifier for boosting tones in a low frequency range;
   a third tone control amplifier for boosting tones in a high frequency range;
   a first variable DC voltage source for varying the gain of said first amplifier;
   second and third variable DC voltage sources for varying the gains of said second and third tone control amplifiers, respectively; and
   first and second differential amplifiers which are operatively coupled to said second and third tone control amplifiers, respectively,
   an output DC voltage of said first variable DC voltage source being applied to said first amplifier to vary the gain of said first amplifier, and to said first and second differential amplifiers, and output DC voltages of said second and third variable DC sources being applied to said first and second differential amplifiers to provide difference voltages, which are applied to said second and third tone control amplifiers to control the gains of said second and third tone control amplifiers, so that the tone in the low and high frequency ranges are boosted, thereby to achieve weighting.

2. A loudness control circuit as claimed in claim 1, which further comprises: a circuit system for inputting the electric field strength of an FM broadcast wave, said circuit system being in parallel with a circuit system for inputting the output DC voltage of said first variable DC voltage source to said first and second differential amplifiers.

3. A loudness control circuit as claimed in claim 1 or 2, in which each of said first and second differential amplifiers is made up to a voltage follower circuit.

* * * * *